United States Patent [19]

Inoguchi

[11] Patent Number: 5,900,647
[45] Date of Patent: May 4, 1999

[54] SEMICONDUCTOR DEVICE WITH SIC AND GAALINN

[75] Inventor: Kazuhiko Inoguchi, Nara, Japan

[73] Assignee: Sharp Kabushiki Kaisha, Osaka, Japan

[21] Appl. No.: 08/794,830

[22] Filed: Feb. 4, 1997

[30] Foreign Application Priority Data

Feb. 5, 1996 [JP] Japan ................................. 8-018561
Feb. 21, 1996 [JP] Japan ................................. 8-033662

[51] Int. Cl.$^6$ ................. H01L 31/0312; H01L 33/00
[52] U.S. Cl. ............... 257/76; 257/77; 257/183; 257/200; 257/103; 257/96; 257/97; 372/44; 372/45; 372/46
[58] Field of Search ................... 257/76, 77, 183, 257/200, 103, 94, 96, 97; 372/44, 45, 46

[56] References Cited

U.S. PATENT DOCUMENTS

| 5,273,933 | 12/1993 | Hatano et al. ....................... 257/77 |
| 5,523,589 | 6/1996 | Edmond et al. ..................... 257/77 |
| 5,679,965 | 10/1997 | Schetzina ........................... 257/103 |
| 5,686,737 | 11/1997 | Allen ................................. 257/77 |

FOREIGN PATENT DOCUMENTS

| 4-223330 | 8/1992 | Japan . |
| 6-326416 | 11/1994 | Japan . |
| 7-249821 | 9/1995 | Japan . |

*Primary Examiner*—William Mintel
*Attorney, Agent, or Firm*—Morrison & Foerster LLP

[57] ABSTRACT

A semiconductor device of the present invention includes: an SiC substrate; an SiC growth layer for absorbing a grating defect of the SiC substrate and/or a damage at and in the vicinity of a surface of the SiC substrate; and $Ga_xAl_yIn_{1-x-y}N$ ($0 \leq x \leq 1$, $0 \leq y \leq 1$) layer formed on the SiC growth layer.

26 Claims, 13 Drawing Sheets

SEMICONDUCTOR DEVICE WITH SIC AND GAALINN

BACKGROUND OF THE INVENTION

1. Field of the Invention

The present invention relates to a compound semiconductor device employing an SiC substrate and a method for producing the same. In particular, the present invention relates to a GaAlInN series compound semiconductor light emitting device and a method for producing the same.

2. Description of the Related Art

A GaAlInN series compound semiconductor is a wide gap semiconductor and has a band structure of a direct transition type. It is expected to be used in developing a light emitting device which emits light having a wavelength in the range of blue to ultra violet (UV). FIG. 12 shows a double-hetero type LED (light emitting diode) which has been used in practice as a gallium nitride series light emitting device. The LED is produced as follows.

First, a GaN or AlN buffer layer 102 is deposited to be about 200 Å-thick on a sapphire C-surface substrate 101 at a substrate temperature of about 600° C. by using an metal organic chemical vapor deposition method (referred to as the "MOCVD method" hereinafter).

Then, an n-type GaN layer 103 for grating matching and an n-type GaAlN cladding layer 104 are grown to be about 4 μm-thick and about 0.5 μm-thick, respectively, on the buffer layer 102 at a substrate temperature of about 1050° C.

Next, the substrate is cooled down to about 800° C., and a Zn-doped GaInN light emitting layer 105 is grown to be about 0.05 μm-thick on the cladding layer 104. Then, the substrate is again heated to about 1050° C., and an Mg-doped GaAlN cladding layer 106 and an Mg-doped GaN contact layer 107 are grown to be about 0.5 μm-thick and about 0.3 μm-thick, respectively, on the light emitting layer 105. After growing these layers, the semiconductor device is taken out of an MOCVD apparatus, and is subjected to a heat treatment in a nitrogen atmosphere at about 600° C. for about 30 minutes so as to lower the resistances of the Mg-doped GaAlN cladding layer 106 and the Mg-doped GaN contact layer 107 and to form these layers as p-type. Then, for forming an n-type electrode, portions of the semiconductor device are etched off by using an RIE (reactive ion etching) method until a portion of the n-type GaN layer 103 is exposed. Finally, an n-side electrode 108 is formed on the exposed portion of the n-type GaN layer 103, and a p-side electrode 109 is formed on the p-type GaN contact layer 107, thus producing the LED.

However, a gallium nitride series semiconductor device employing a sapphire substrate has the following problems.

There is a considerable difference between the grating constant of the sapphire substrate and that of the GaN layer. Accordingly, there exists a lattice mismatching of about 16% or more, and the resulting misalignment at the interface between the sapphire substrate and the GaN layer leads to a grating defect in the GaN layer. For reducing the grating defect, it has been proposed, as in the conventional technique above, to insert a GaN or AlN buffer layer grown at a relatively low temperature of about 600° C. between the sapphire substrate and the GaN layer, or to clean the surface of the substrate by using a chemical etching method. However, there still exists a large amount (about $10^{10}$ to $10^{11}$ cm$^{-2}$) of grating defect at the surface of the buffer layer, thus deteriorating the performance of the LED at high temperatures and hence the reliability of the device.

In the gallium nitride series light emitting device, it has been proposed to employ, an SiC substrate in place of a sapphire substrate since the lattice constant of the SiC substrate is relatively close to that of a GaN layer as compared to a saphire substrate. Despite the relatively close grating constants, however, laser oscillation has not been realized in a gallium nitride series semiconductor laser device employing the SiC substrate. Therefore, it has also been proposed to form an AlN buffer layer on the SiC substrate for improving the lattice matching therebetween. FIG. 13 shows the structure of the GaAlInN series semiconductor laser device employing the SiC substrate. The production process of the GaAlInN series semiconductor laser device will be now described.

First, an AlN buffer layer 203 is grown to be about 0.2 μm-thick on an SiC substrate 201 at a substrate temperature of about 1100° C. by using an MOCVD method. Next, an n-type GaN layer 204 and an n-type GaAlN lower cladding layer 205 are formed to be about 4 μm-thick and about 0.5 μm-thick, respectively, on the AlN buffer layer 203 at a substrate temperature of about 1050° C. Then, the substrate is cooled down to about 800° C., and a GaInN active layer 206 is grown to be about 100 Å-thick on the lower cladding layer 205. Then, the substrate is again heated to about 1050° C., and an Mg-doped GaAlN cladding layer 207 and an Mg-doped GaN contact layer 208 are grown to be about 0.5 μm-thick and about 0.3 μm-thick, respectively, on the active layer 206.

After growing these layers, the semiconductor device is taken out of the MOCVD apparatus, and is subjected to a heat treatment in a nitrogen atmosphere at about 600° C. for about 30 minutes so as to lower the resistances of the Mg-doped GaAlN cladding layer 207 and the Mg-doped GaN contact layer 208 and to form these layers as p-type layers. Then, an $Al_2O_3$ film 210 including apertures 209 in strips is formed by using an electron beam deposition method and a photolithography process. A p-side electrode 211 is formed so as to entirely cover the $Al_2O_3$ film 210 and the Mg-doped GaN contact layer 208. An n-side electrode 212 is formed over the entire bottom surface of the SiC substrate 201. The GaAlInN series semiconductor laser device is thus produced.

Such a semiconductor laser device has the following problems.

The AlN buffer layer is deposited on the SiC substrate for improving the lattice matching. However, the defect at the surface of the AlN buffer layer is still about $10^8$ to $10^{10}$ cm$^{-2}$. This is merely a $10^2$ cm$^{-2}$ reduction from the defect between the AlN buffer layer and the sapphire substrate. Thus, light and carriers are not satisfactorily confined within the active layer. Moreover, crystalline quality sufficient to undergo a carrier injection of about $10^{19}$ cm$^{-3}$ required for laser oscillation has not been realized. Thus, laser oscillation by current injection has not been realized.

As described above, the gallium nitride series semiconductor material is strongly expected to offer a suitable material for a light emitting device which emits light having a wavelength in the range of blue to UV. However, a production method which can sufficiently reduce the grating defect in a layer of the gallium nitride series compound has not been realized and, therefore, laser oscillation by current infusion has not been realized.

SUMMARY OF THE INVENTION

According to one aspect of the present invention, a semiconductor device includes: an SiC substrate; an SiC growth layer for absorbing a grating defect of the SiC substrate and/or damage at and in the vicinity of a surface of the SiC substrate; and a $Ga_xAl_yIn_{1-x-y}N$ ($0 \leq x \leq 1, 0 \leq y \leq 1$) layer formed on the SiC growth layer.

According to another aspect of the present invention, a semiconductor device is produced by epitaxially growing an SiC layer on an SiC substrate to have a thickness sufficient for absorbing a grating defect of the SiC substrate and/or damage at and in the vicinity of a surface of the SiC substrate; and forming a $Ga_xAl_yIn_{1-x-y}N$ ($0 \leq x \leq 1, 0 \leq y \leq 1$) layer on the SiC layer.

According to still another aspect of the present invention, a method for producing a semiconductor device including an SiC substrate and a $Ga_xAl_yIn_{1-x-y}N$ ($0 \leq x \leq 1, 0 \leq y \leq 1$) layer, includes the steps of: epitaxially growing an SiC layer on the SiC substrate to have a thickness sufficient for absorbing a defect of the SiC substrate and/or damage at and in the vicinity of a surface of the SiC substrate; and growing the $Ga_xAl_yIn_{1-x-y}N$ layer on the SiC layer. The SiC layer may be grown by MOCVD method using silane gas and propane gas as material gases.

In one embodiment of the invention, a thickness of the SiC growth layer is about 10 to 40 times a thickness of a portion of the SiC substrate where the defect and/or damage exists.

In another embodiment of the invention, a thickness of the SiC growth layer is about 1 to 4 $\mu$m.

In still another embodiment of the invention, the SiC growth layer has a thickness determined in accordance with a thickness of a portion of the SiC substrate where the defect and/or damage exists.

In still another embodiment of the invention, the SiC growth layer contains an n-type impurity. The SiC growth layer may contain nitrogen as the n-type impurity. It is preferable that a carrier concentration of the SiC layer is in a range of $1 \times 10^{17}$ cm$^{-3}$ to $1 \times 10^{19}$ cm$^{-3}$.

In still another embodiment of the invention, the SiC substrate is a p-type SiC substrate. A carrier concentration of the p-type SiC substrate may be in a range of about $1 \times 10^{17}$ cm$^{-3}$ to $1 \times 10^{19}$ cm$^{-3}$.

In still another embodiment of the invention, the SiC growth layer contains a p-type impurity. The SiC growth layer may contain aluminum as the p-type impurity. It is preferable that a carrier concentration of the SiC layer is in a range of $1 \times 10^{17}$ cm$^{-3}$ to $1 \times 10^{19}$ cm$^{-3}$.

In still another embodiment of the invention, the semiconductor device further includes a pair of electrodes so as to sandwich the SiC substrate, the SiC growth layer and the $Ga_xAl_yIn_{1-x-y}N$ layer therebetween.

In still another embodiment of the invention, a double-hetero structure including the $Ga_xAl_yIn_{1-x-y}N$ layer is formed on the SiC growth layer grown on the SiC substrate.

Thus, the invention described herein makes possible the advantages of (1) providing a high-efficiency gallium nitride series compound semiconductor light emitting device employing an SiC substrate; and (2) realizing a desirable low-resistance p-type ohmic electrode, thereby providing a reliable gallium nitride series compound semiconductor device of high quality.

These and other advantages of the present invention will become apparent to those skilled in the art upon reading and understanding the following detailed description with reference to the accompanying figures.

DESCRIPTION OF THE PREFERRED EMBODIMENTS

A substrate to be used for a compound semiconductor device is usually finished by polishing using an abrasive of, for example, diamond particles (typically with a grain diameter of about 0.1 $\mu$m) or a slurry (typically about 0.5 $\mu$m). When polishing, the abrasive or the slurry may cause a physical and/or chemical damage (e.g., cleaved bonds) at the surface of the SiC substrate. Therefore, an additional step for removing such damage is performed after the polishing process. Despite this damage removal step, however, some damage still remains to some depth from the surface of the substrate. The present invention is based on assumption that the physical/chemical damage remaining on the SiC substrate unfavorably affects a layer to be formed on the SiC substrate (e.g., a GaN layer), and reduces the defect in the layer to be formed on the SiC substrate by reducing the effect of the defect and/or the aforementioned damage at and in the vicinity of the SiC substrate.

More specifically, according to the present invention, the AlN layer (or the GaN layer), which is used in the conventional GaAlInN series semiconductor device, is not grown directly on the SiC substrate, but an SiC layer is epitaxially grown on the SiC substrate so as to absorb the influence of the damage which remains at and in the vicinity of the surface of the SiC substrate and is generated during the polishing process of the surface of the SiC substrate.

Hereinafter, a compound semiconductor device of the present invention will be described with reference to the accompanying figures, providing an example of a semiconductor laser device employing an SiC substrate and including a double-hetero structure of GaInN active layer/GaAlN cladding layer. Throughout the figures, like numbers denote like components.

EXAMPLE 1

Figure 1:
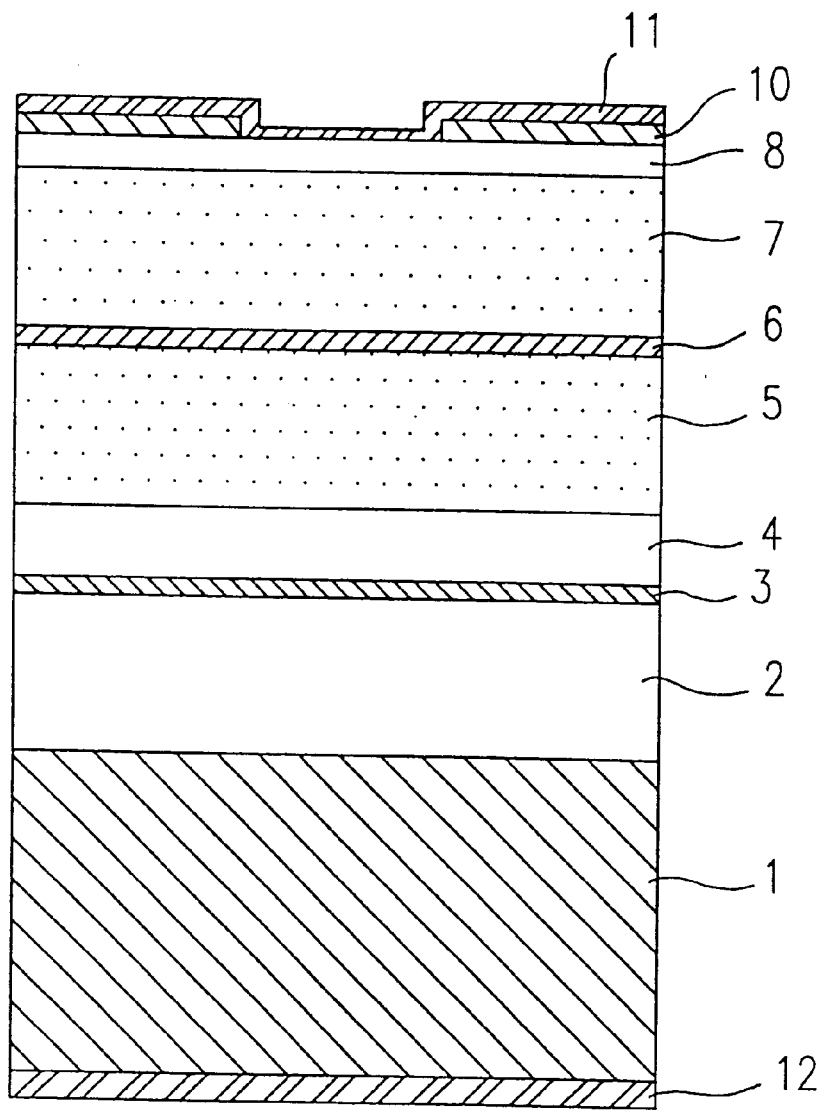
FIG. 1 is a cross-sectional view showing a the III group nitride series compound semiconductor device according to Example 1 of the present invention.

FIG. 1 shows the structure of a semiconductor laser device using a gallium nitride series compound semiconductor material according to Example 1 of the present invention.

In the semiconductor laser device of Example 1, an n-type SiC growth layer 2 is epitaxially grown on an n-type SiC substrate 1 so as to reduce the influence of the defect and/or the physical/chemical damage of the SiC substrate 1 on layers to be formed above the SiC substrate 1.

Hereinafter, the production process of the semiconductor laser device using the gallium nitride series compound will be described referring to FIGS. 2A to 2D.

First, the substrate 1 is subjected to a surface polishing process and then a process (e.g., an oxidization process) for removing a portion of the substrate 1 including damage caused by the polishing process. For the substrate 1 used in the present example, a 6H-SiC substrate which is about 5° off an n-type (0001) carbon surface toward the <1120> direction, is buff-finished with a slurry of about 0.5 $\mu$m and then subjected to the oxidization process. The SiC substrate 1 is then set in a reactor of an MOCVD apparatus. The reactor is well substituted by hydrogen, heated to about 1500° C. while supplying a hydrogen flow into the reactor, and maintained in such a condition for about 10 minutes, thereby cleaning the surface of the SiC substrate 1.

Figure 2A:
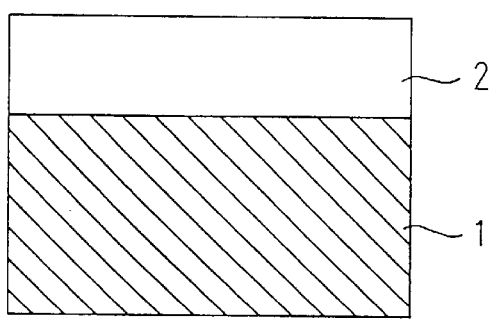
FIGS. 2A to 2D are cross-sectional views showing the production process of the III group nitride series compound semiconductor device according to Example 1 of the present invention.

Then, an n-type SiC growth layer 2 for absorbing the effect of the physical/chemical damage remaining at and in the vicinity of the SiC substrate 1 is epitaxially grown. The thickness of the n-type SiC growth layer 2 is determined based on the thickness of a portion including the physical/chemical damage (hereinafter, referred to as "a damaged surface portion") from the surface of the SiC substrate 1. In the present example, the thickness of the damaged surface portion (e.g., of a scratch) at the surface of the SiC substrate 1 is about 0.1 $\mu$m. Considering the thickness of the damaged surface portion, about 10 cc/min of silane gas and about 10 cc/min of propane gas as material gases (raw materials); about 10 l/min of hydrogen gas as a carrier gas; and about 50 cc/min of nitrogen gas as an n-type impurity, are supplied into the reactor for about 60 minutes, thereby growing the n-type SiC growth layer 2 to be about 2 $\mu$m-thick. FIG. 2A shows the device in cross section after these steps have been performed.

Then, the substrate is cooled down to about 1050° C. and, when the temperature becomes stable at about 1050° C., about 3×10$^{-5}$ mol/min of trimethylaluminum (referred to as simply "TMA" hereinafter) and about 5 l/min of ammonium are supplied into the reactor for about 5 minutes, thereby growing an AlN layer 3 to be about 0.1 $\mu$m-thick.

Then, about 3×10$^{-5}$ mol/min of trimethylgallium (referred to as simply "TMG" hereinafter), about 5 l/min of ammonia, and about 0.3 cc/min silane gas as a material gas for Si-doping are supplied into the reactor for about 15 minutes, thereby growing an n-type GaN layer 4.

Then, in addition to ammonia, TMG, and silane gas, about 6×10$^{-6}$ mol/min of TMA is supplied into the reactor for about 25 minutes, thereby growing an n-type Ga$_{0.85}$Al$_{0.15}$N lower cladding layer 5 to be about 1 $\mu$m-thick. The electron concentration of the layer 5 is about 2×10$^{18}$ cm$^{-3}$.

Then, the supplies of TMG, TMA, and silane gas are terminated, and the reactor is cooled down to about 800° C. When the temperature becomes stable at about 800° C., TMG at the above-mentioned flow rate and about 4×10$^{-4}$ mol/min of trimethylindium (referred to as simply "TMI" hereinafter) are supplied into the reactor for about 12 seconds, thereby growing a Ga$_{0.75}$In$_{0.25}$N active layer 6 to be about 10 nm-thick.

Then, the supplies of TMG and TMI are terminated and the reactor is again heated to about 1050° C. When the temperature becomes stable at about 1050° C., TMG at the above-mentioned flow rate, TMA at the above-mentioned flow rate and about 5×10$^{-6}$ mol/min of Cp$_2$Mg (cyclopentadienylmagnesium) are supplied for about 25 minutes, thereby growing an Mg-doped Ga$_{0.85}$Al$_{0.15}$N upper cladding layer 7 to be about 1 $\mu$m-thick.

Figure 2B:
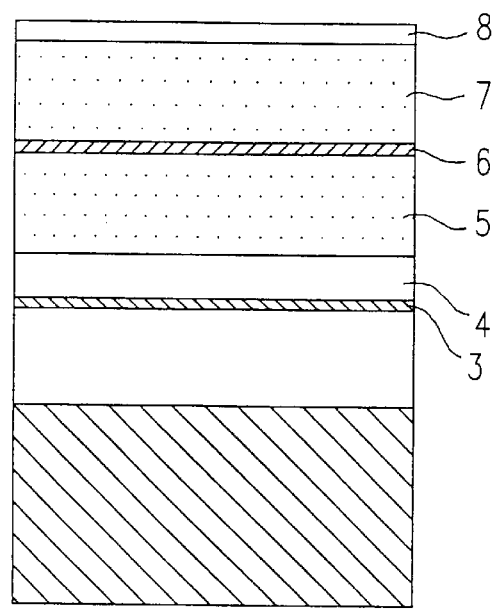

Then, only the supply of TMA is terminated while letting the device grow for about 7.5 minutes, thereby growing an Mg-doped GaN contact layer 8 to about 300 nm-thick. FIG. 2B shows the device in cross section after these steps are performed. Through these processing steps, a semiconductor device of a double-hetero type multi-layer structure is produced with the n-type SiC growth layer 2 being deposited on the 6H-SiC substrate 1.

Then, the semiconductor device is taken out of the MOCVD apparatus and placed in a nitrogen atmosphere outside the MOCVD apparatus, and subjected to a heat treatment in the nitrogen atmosphere at about 600° C. for about 20 minutes so as to lower the resistances of the Mg-doped Ga$_{0.85}$Al$_{0.15}$N upper cladding layer 7 and the Mg-doped GaN contact layer 8 and to form these layers as p-type layers. After this process, the hole concentration of the layers 7 and 8 is about 1×10$^{18}$ cm$^{-3}$.

Figure 2C:
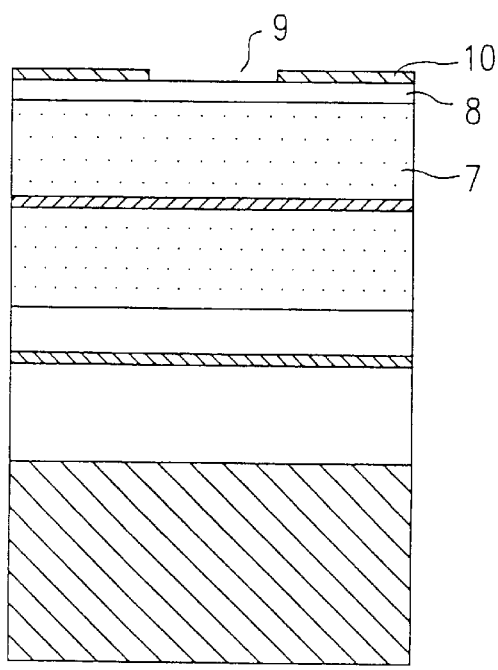

Then, an Al$_2$O$_3$ film 10 including apertures 9 in strips each having a width of about 1 $\mu$m is formed as a protective layer on the Mg-doped GaN contact layer 8 by using an electron beam deposition method and a photolithography process. FIG. 2C shows the device in cross section after these steps have been performed.

Figure 2D:
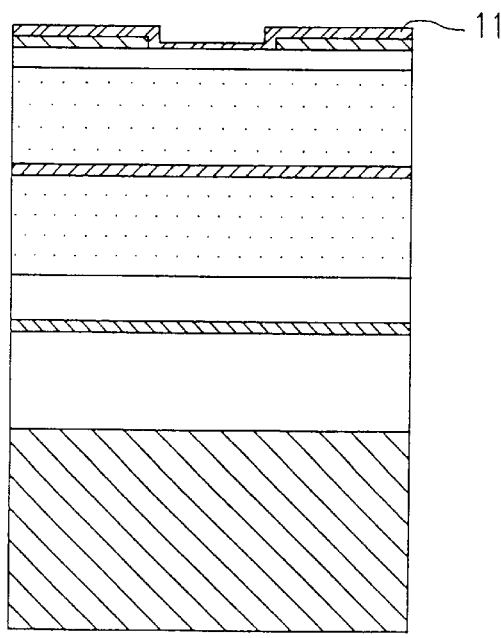

Then, a p-side electrode 11 of an Au/Ni multi-layer film is formed so as to entirely cover the Al$_2$O$_3$ film 10 and the Mg-doped GaN contact layer 8 by using a vacuum evaporation method. FIG. 2D shows the device in cross section after these steps have been performed.

Then, a mirror surface of a cavity is formed as follows. An SiO$_2$ film as a mask is formed on the upper surface of the wafer by using an electron beam deposition method and a photolithography process so as to be in strips each having a width of about 500 $\mu$m. The strips extend in the direction perpendicular to the direction of the electrode strips of the p-side electrode 11 and are spaced apart from one another by about 50 $\mu$m, thereby defining aperture strips of about 50 $\mu$m-wide. Then, the wafer with the SiO$_2$ film including the aperture strips is introduced into a reactive ion etching apparatus. For forming a reflection mirror, portions of the gallium nitride series semiconductor layer being exposed through the apertures of the SiO$_2$ film are etched off by using a reactive ion etching method until the n-type SiC growth layer 2 is exposed. Then, the 6H-SiC substrate 1 is polished to be about 100 μm in thickness, and the $SiO_2$ film as a mask is removed.

Then, an n-side electrode 12 is formed over the entire bottom surface of the SiC substrate 1.

Finally, the wafer is diced into chips and packaged through an ordinary process. The GaAlInN series semiconductor laser device of Example 1 is thus produced.

When an electric current is applied to the produced semiconductor laser device, laser oscillation of a blue wavelength of about 432 nm is observed at a threshold current of about 40 mA.

As described above, the surface of the SiC substrate 1 is buff-finished using a slurry of about 0.5 μm. After the oxidization process, damage, such as a scratch, remaining at and in the vicinity of the surface of the substrate 1 is measured to be about 0.1 μm in thickness. The defect at the surface of the n-type SiC growth layer 2 formed to be about 2 μm in thickness on the processed substrate 1 is greatly reduced to be about $10^4$ to $10^5$ $cm^{-2}$. It is believed that growing the n-type SiC growth layer 2 to be about 20 times as thick as the thickness of the damaged surface portion of the SiC substrate 1 reduces the defect of a layer above the SiC substrate 1, which is generated due to the defect and/or the damage caused by the process for polishing the SiC substrate surface, as above.

Figure 3:
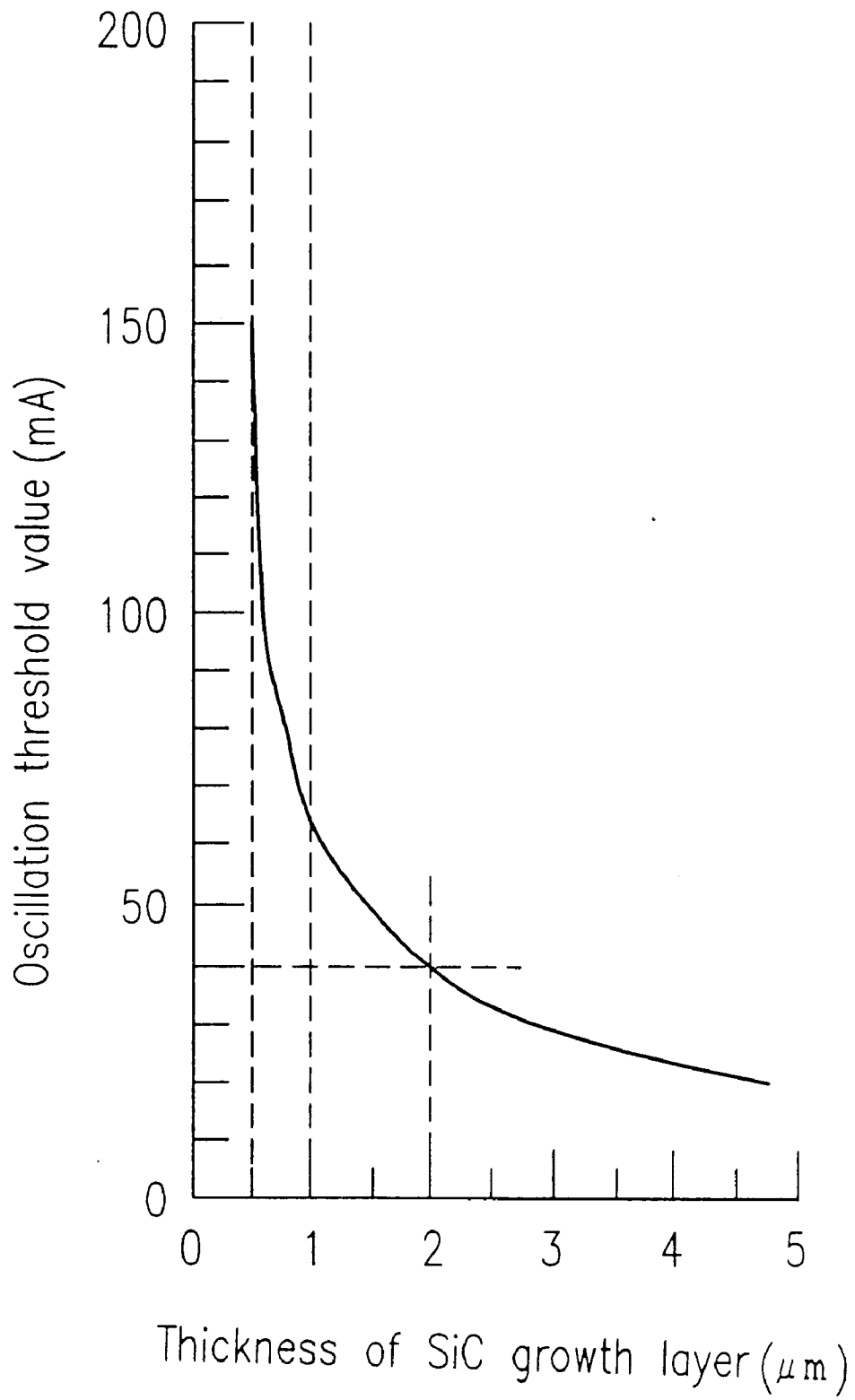
FIG. 3 is a graph showing the relationship between an SiC growth layer and an oscillation threshold current of the semiconductor device according to Example 1 of the present invention.

FIG. 3 is a graph showing the relationship between the oscillation threshold current of a semiconductor laser device and the thickness of the n-type SiC growth layer 2. This relationship was obtained by the inventor of the present invention in order to assess the effect of the existence of the n-type SiC growth layer 2 on the performance of the obtained semiconductor laser device. The values of the graph of FIG. 3 are obtained by testing semiconductor laser devices such that the thickness of the damaged surface portion from the surface of the SiC substrate 1 is about 0.1 μm.

As shown in FIG. 3, as the n-type SiC growth layer 2 becomes thinner, the threshold current of the semiconductor laser device increases. As the thickness of the n-type SiC growth layer 2 becomes less than about 1 μm, the threshold current of the device rapidly increases. In particular, when the thickness of the n-type SiC growth layer 2 is less than about 0.5 μm, oscillation is not observed. As the thickness of the n-type SiC growth layer 2 becomes greater than about 4 μm, the change in the threshold value becomes nominal. In other words, the n-type SiC growth layer 2 of an excessively small thickness results in an insufficient effect of reducing the crystalline defect caused by damage remaining at and in the vicinity of the surface of the SiC substrate 1. Therefore, such a thickness is undesirable. On the other hand, the n-type SiC growth layer 2 of an excessively large thickness is not practical since such a thick n-type SiC growth layer would require such a long time to grow. Therefore, such a thickness is also undesirable. Accordingly, a preferred thickness of the SiC growth layer 2 for absorbing the grating defect and/or damage remaining at and in the vicinity of the SiC substrate surface is about 10 to 40 times the thickness of the damaged surface portion of the SiC substrate 1.

Also, similar effects can be obtained by using a substrate which is not 5° off the n-type surface.

The semiconductor laser device of Example 1 employs the GaInN active layer/GaAlN cladding layer combination. However, the present invention is not limited to such a combination. Similar effects can be obtained by employing other combinations such as GaInN active layer/GaN cladding layer, GaN active layer/GaAlN cladding layer, or a combination of quaternary compound semiconductor devices such as a GaAlInN series semiconductor device.

In Example 1, a compound semiconductor laser device employing an SiC substrate has been described. However, the present invention may also be applied to LEDs employing an SiC substrate. In the LEDs, epitaxial growth of the SiC growth layer on the SiC substrate can also reduce propagation of the defect and/or the physical/chemical damage caused by the surface polish process to a layer above the SiC substrate, thereby improving the performance at high temperatures and hence the reliability of LEDs. The reduction of the defect and/or the physical/chemical damage, which propagates from the surface of the SiC substrate to a layer above the SiC substrate, is also effective in improving performances of other types of semiconductor devices.

EXAMPLE 2

In Example 2 of the present invention, an AlGaN/InGaN double-hetero structure and a ridge-guide structure are formed above an SiC substrate, thereby producing a blue semiconductor laser device. In this example, an SiC growth layer is also formed on the SiC substrate in order to absorb the adverse effect of the defect and/or the physical/chemical damage remaining at and in the surface of the SiC substrate surface, as in Example 1. The strip-shaped ridge structure is formed by a selective growth method.

Figure 4:
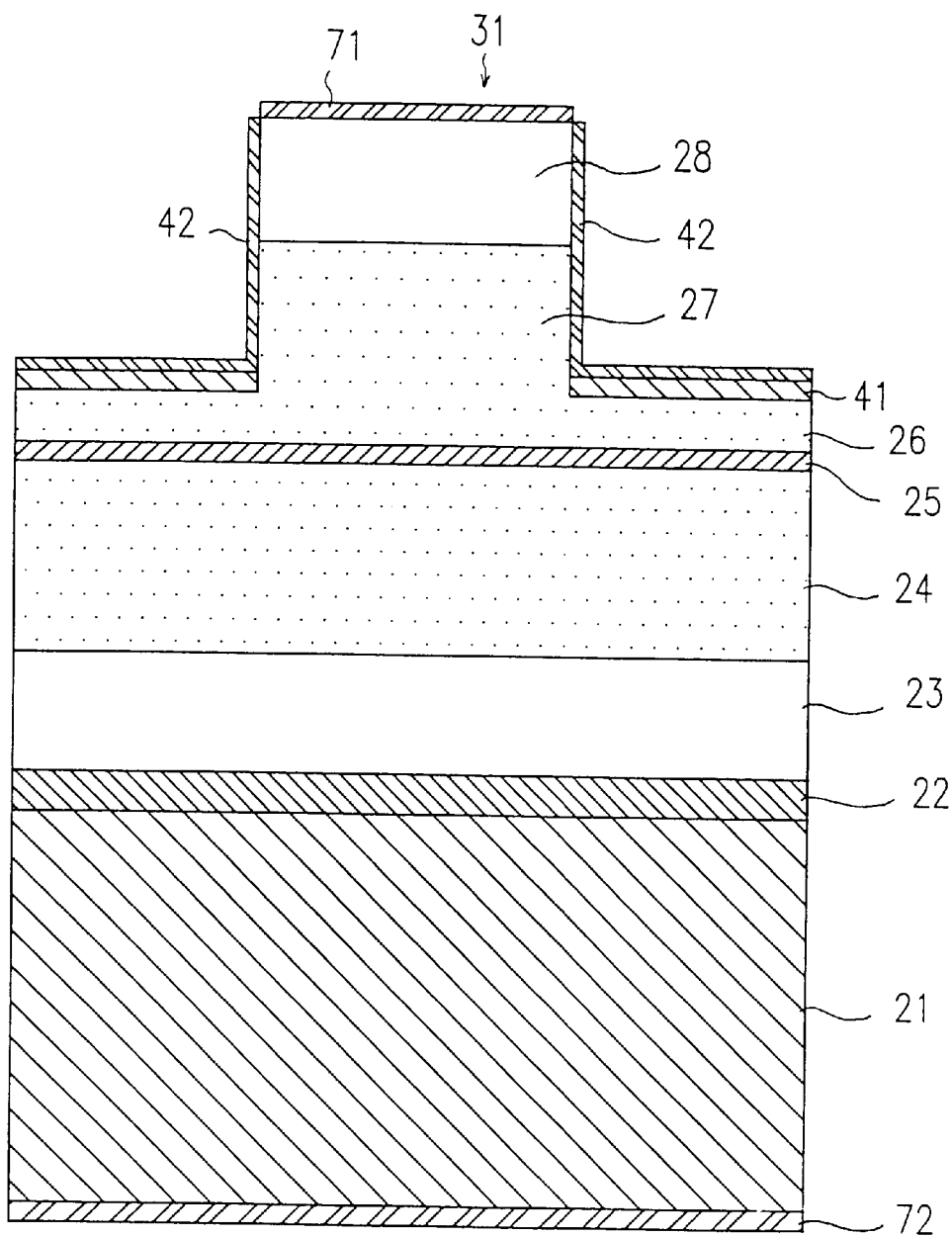
FIG. 4 is a cross-sectional view showing a structure of the III group nitride series compound semiconductor device according to Example 2 of the present invention.

FIG. 4 shows the structure of the III group nitride series compound semiconductor laser device according to Example 2 of the present invention. FIGS. 5A to 5E show the production process of the III group nitride series compound semiconductor laser device shown in FIG. 4.

First, the SiC substrate 21 is subjected to the surface polishing process, the process for removing damage caused by the surface polishing process, such as the oxidization process, and the cleaning process in the same manner as that of Example 1. As in Example 1, a 6H-SiC substrate is used as the SiC substrate 21.

Figure 5A:
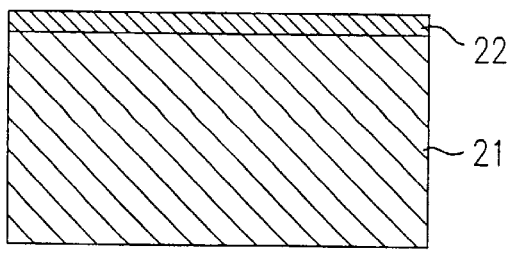
FIGS. 5A to 5E are cross-sectional views showing the production process of the III group nitride series compound semiconductor device according to Example 2 of the present invention.

After cleaning the surface of the substrate 21, an SiC growth layer 22 is epitaxially grown in an MOCVD apparatus, as shown in FIG. 5A. The thickness of the SiC growth layer 22 is determined considering the thickness of the damaged surface portion of the substrate 21. In Example 2, the thickness of the damaged surface portion is 0.1 μm, and therefore the thickness of the SiC growth layer 22 is determined to be about 2 μm. The SiC growth layer 22 having this thickness is grown by supplying about 10 cc/min of silane gas and about 10 cc/min of propane gas as material gases (raw materials); about 10 l/min of hydrogen gas as a carrier gas; and about 50 cc/min of nitrogen gas as an n-type impurity into the reactor for about 60 minutes.

Figure 5B:
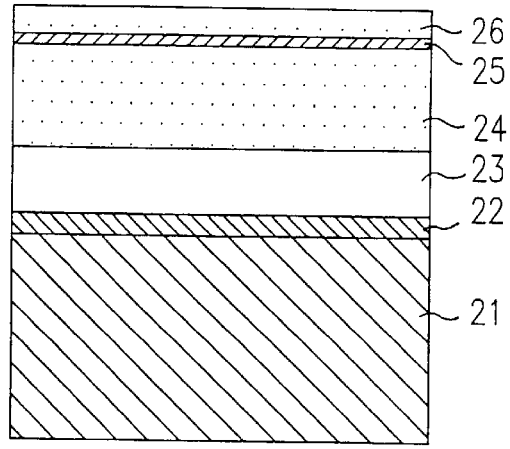

Next, III group nitride series compound semiconductor layers are grown by using an MOCVD method, to obtain the double-hetero structure as shown in FIG. 5B.

About $3 \times 10^{-5}$ mol/min of TMG, about 5 l/min of ammonia ($NH_3$), and an about 0.3 cc/min silane gas ($SiH_4$) are supplied into the reactor for about 15 minutes, thereby growing an n-type GaN layer 23 to be about 0.5 μm-thick. Then, in addition to $NH_3$ and TMG, about $6 \times 10^{-6}$ mol/min of TMA and about 0.3 cc/min of $SiH_4$ are supplied into the reactor for about 25 minutes, thereby growing an $Al_{0.15}Ga_{0.85}N$ layer 24 to be about 1 μm-thick. The electron concentration of the layer 24 is about $2 \times 10^{18}$ $cm^{-3}$.

Next, the supplies of TMG, TMA, and $SiH_4$ are terminated, and the reactor is cooled down to about 800° C. When the temperature becomes stable at about 800° C., TMG at the above-mentioned flow rate and about $4 \times 10^{-4}$ mol/min TMI are supplied into the reactor for about 4 seconds, thereby growing an $In_{0.25}Ga_{0.75}N$ layer 25 to be about 3 nm-thick. The emission peak wavelength from this layer at room temperature is about 432 nm.

Then, the supplies of TMG and TMI are terminated and the reactor is again heated to about 1050° C. When the temperature becomes stable at about 1050° C., TMA at the above-mentioned flow rate and about $5 \times 10^{-6}$ mol/min $Cp_2Mg$ are supplied for about 5 minutes, thereby growing a p-type $Al_{0.15}Ga_{0.85}N$ layer 26 to be about 0.2 $\mu$m-thick.

Figure 5C:
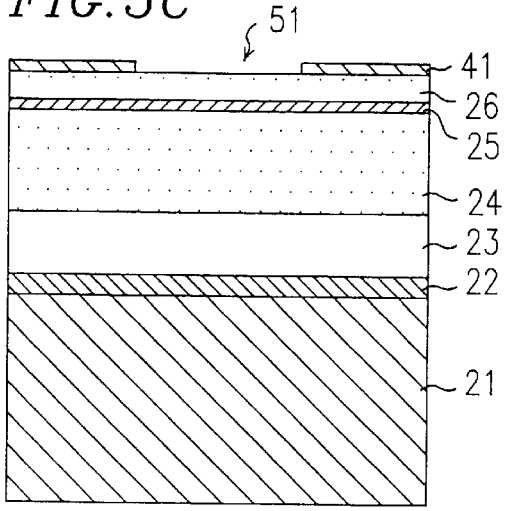

Then, the double-hetero multi-layer structure of the III group nitride series compound semiconductor is grown on the substrate. The wafer including the double-hetero multi-layer structure is taken out of the MOCVD apparatus, and an $SiO_2$ film 41 including apertures 51 in strips each having a width of about 1 $\mu$m is formed. The $SiO_2$ film 41 is formed by using an ordinary electron beam deposition method and a photolithography process (FIG. 5C).

The wafer now includes the double-hetero multi-layer structure of the III group nitride series compound semiconductor and the $SiO_2$ film 41 including the aperture strips 51 each having a width of about 1 $\mu$m. The wafer is again introduced into the MOCVD apparatus. The reactor of the MOCVD apparatus is well substituted by hydrogen, heated to about 1050° C. while supplying hydrogen and $NH_3$ flows into the reactor. When the temperature becomes stable at about 1050° C., about $3 \times 10^{-5}$ mol/min of TMG, about $6 \times 10^{-6}$ mol/min of TMA, about 5 l/min of $NH_3$, and about $5 \times 10^{-6}$ mol/min of $Cp_2Mg$ are supplied into the reactor for about 20 minutes, thereby growing an M-doped $Al_{0.15}Ga_{0.85}N$ layer 27 to be about 0.8 $\mu$m-thick in the about 1 $\mu$m-wide aperture strips 51 (spaced apart from one another by about 300 $\mu$m) of the $SiO_2$ film 41. The layer 27 is selectively grown exclusively in the aperture strips 51. Accordingly, no semiconductor layer is grown on the $SiO_2$ film 41.

Figure 5D:
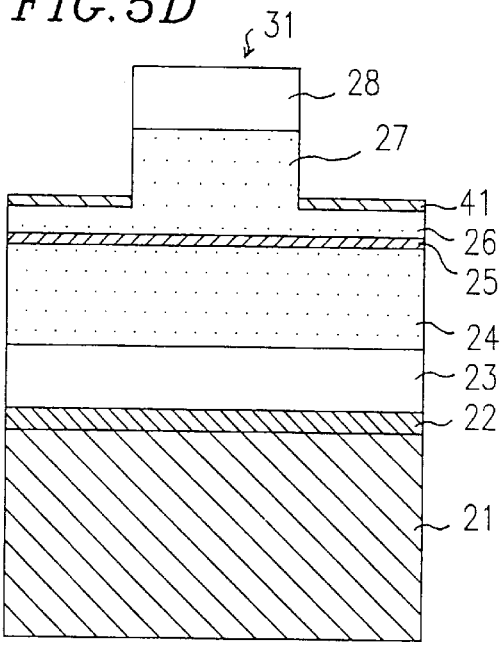

Then, only the supply of TMA is terminated while letting the device grow for about 10 minutes, thereby growing an Mg-doped GaN layer 28 to be about 0.5 nm-thick, as shown in FIG. 5D.

As shown in FIG. 5D, as a result of the selective growth only on the portions of the device excluding the $SiO_2$ film 41, ridges 31 in strips are formed as a light waveguide. The wafer including the ridges formed thereon is taken out of the MOCVD apparatus and subjected to a heat treatment in an nitrogen atmosphere at about 700° C. for about 20 minutes so as to lower the resistances of the Mg-doped $Al_{0.15}Ga_{0.85}N$ layer 27 and the Mg-doped GaN layer 28 and to form these layers as p-type. After this process, the hole concentration of the layers 27 and 28 is about $1 \times 10^{16}$ $cm^{-3}$.

Figure 5E:
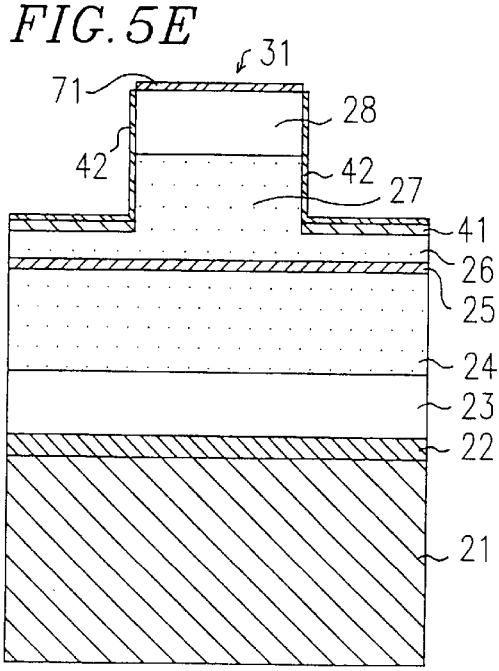

Then, an $Al_2O_3$ film 42 as a protective layer is formed on the side walls of the ridge strips 31 by using an electron beam deposition method. An Au/Ni multi-layer film is then deposited only on the upper surface of the ridges 31, thereby forming electrodes 71, as shown in FIG. 5E.

Next, an $SiO_2$ film is formed on the entire upper surface of the wafer by using an electron beam deposition method 50 as to be in strips each having a width of about 500 $\mu$m. The strips extend in the direction perpendicular to the direction of the electrode strips 71 of the Al/Ti multi-layer film and are spaced apart from one another by about 50 $\mu$m, thereby defining aperture strips of about 50 $\mu$m-wide. The $SiO_2$ film is formed by using an ordinary electron beam deposition method and a photolithography process.

The wafer with the $SiO_2$ film including the aperture strips is then introduced into an RIE apparatus. For forming a reflection mirror, portions of the nitride gallium series semiconductor layer being exposed through the aperture strips of the $SiO_2$ film are etched off by using an RIE method nearly reaching the AlN buffer layer 22. Then, after the SiC substrate 21 is polished to be about 100 $\mu$m in thickness, Ni is deposited on the entire bottom surface of the SiC substrate 21 so as to form an ohmic electrode 72 on the SiC substrate 21, thus producing the semiconductor laser device as shown in FIG. 4.

Finally, the wafer is divided into chips by scribing or dicing and packaged through an ordinary process.

When an electric current is applied to the produced semiconductor laser device, laser oscillation of a blue wavelength of about 432 nm is observed at a threshold current of typically about 40 mA. The radiation angle characteristic of the device is such that the vertical spreading angle is about 24° and the horizontal spreading angle is about 12° with the ellipticity being about 2. The astigmatic distance of the device is about 1 to about 5 $\mu$m.

The device of Example 2 has an oscillation threshold value in the range of about 38 to 42 mA and a horizontal spreading angle in the range of about 11.5 to 12.5°. This indicates that the device is superior to the device in which a ridge stripe is fabricated by etching in controlling the thickness of the cladding layer external to the ridge strips. When using a $\phi$2 inch substrate, the thickness control accuracy for the AlGaN layer by using an MOCVD method is about ±2%.

Although the 6H-SiC substrate 21, which is about 5° off an n-type (0001) carbon surface toward the <1120> direction, is used in Example 2, it is also applicable to use a p-type substrate. In such a case, the conduction type of each layer in Example 2 needs to be reversed. Also, similar effects can be obtained by using a substrate which is not off. Moreover, the present invention is not limited to 6H-SiC. Similar or better effects can be obtained by employing 4H-SiC or, if available, 2H-SiC.

The semiconductor laser device which emits blue light and employs the $In_{0.25}Ga_{0.75}N$ active layer/$Al_{0.15}Ga_{0.85}N$ cladding layer combination is described in Example 2. However, the present invention is not limited to such a combination. Similar effects can be obtained by employing other combinations such as InGaN active layer/GaN cladding layer, or GaN active layer/AlGaN cladding layer.

As described in Example 2, the adverse effect of the defect and/or the physical/chemical damage caused by the surface polishing process of the SiC substrate 21 on the layers located above the SiC substrate 21 can be reduced by epitaxially growing the SiC growth layer 22 having sufficient thickness for absorbing the defect and/or damage of the SiC substrate surface.

Next, examples of the semiconductor device using a p-type SiC substrate will be described. In the examples described below, in order to realize an excellent p-type ohmic electrode, the p-type SiC substrate is used instead of the n-type SiC substrate used in Examples 1 and 2, and therefore the p-type electrode is formed on the opposite surface of the SiC substrate to the surface above which the double-hetero multi-layer structure of the III group nitride series compound semiconductor is formed. The reason is as follows.

In a research for a desirable electrode formation particularly on the p-type semiconductor layer, which is performed by the inventor of the present invention, metal electrodes most suitable for a p-type GaN layer and a p-type SiC layer are formed on the respective layers, and the contact resistance in each case has been evaluated and compared with the other. Moreover, the crystalline quality of each semiconductor layer has been compared with the other by assessing the full width at half maximum of the X-ray diffraction profile.

Figure 10:
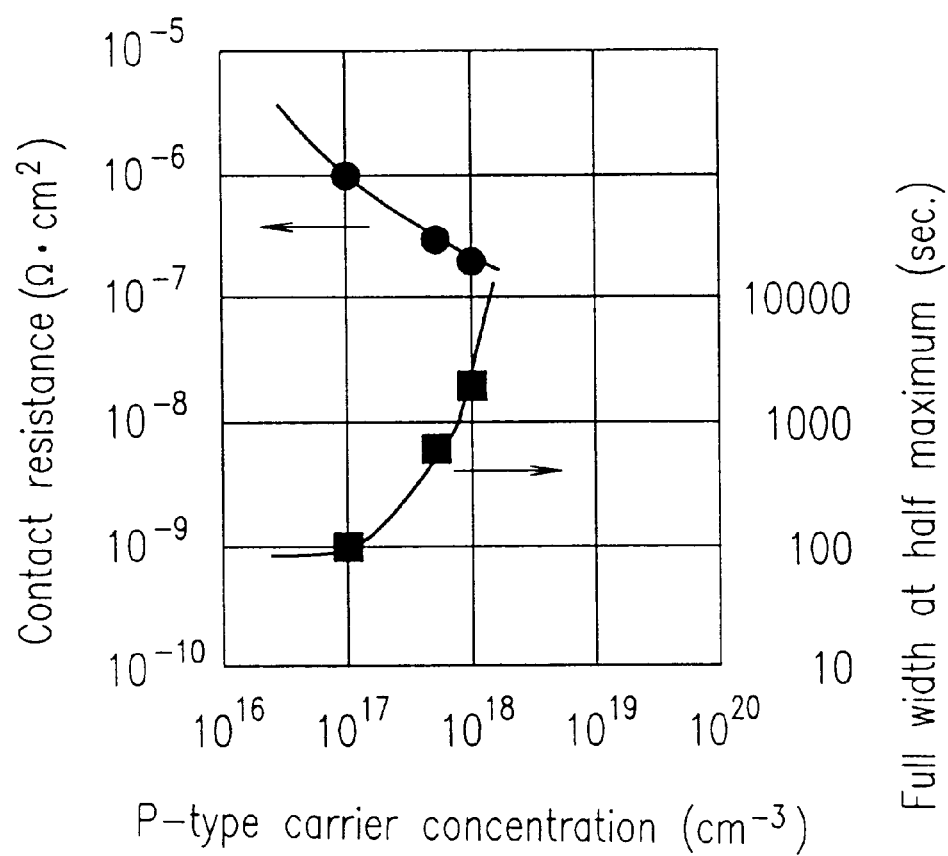
FIG. 10 shows the relationship between a p-type carrier concentration, contact resistance, and a full width at half maximum of the X ray diffraction profile of a p-type GaN layer in the case where an Au/Ni electrode is formed on the p-type GaN layer.

FIG. 10 shows the p-type carrier concentration dependency of the contact resistance in the case where an Au/Ni electrode is formed on the p-type GaN layer. FIG. 10 also shows the p-type carrier concentration dependency of the full width at half maximum of the X-ray diffraction profile of the p-type GaN layer. The contact resistance decreases as the p-type carrier concentration increases. However, the p-type carrier concentration can be increased only to about $1 \times 10^{18}$ cm$^{-3}$, where the contact resistance is about $2 \times 10^{-7}$ $\Omega \cdot$cm$^2$. The full width at half maximum of the X-ray diffraction profile, which indicates the crystalline quality of the p-type GaN layer, increases as the p-type carrier concentration increases. The full width at half maximum of the X-ray diffraction profile is about 100 seconds when the p-type carrier concentration is about $1 \times 10^{17}$ cm$^{-3}$, but is increased to about 10000 seconds when the p-type carrier concentration is about $1 \times 10^{18}$ cm$^{-3}$, thus indicating a deterioration of the crystalline quality.

Figure 11:
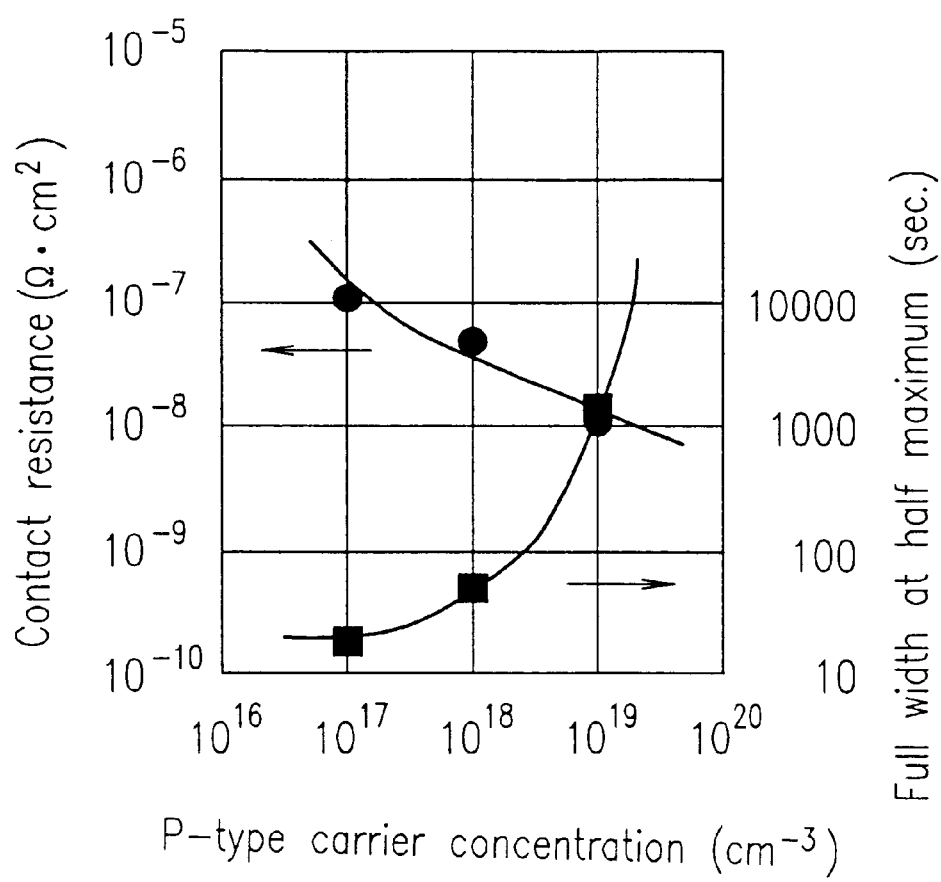
FIG. 11 shows the relationship between a p-type carrier concentration, contact resistance, and a full width at half maximum of the X ray diffraction profile of a p-type SiC layer in the case where an Au/Ni electrode is formed on the p-type SiC layer.
Figure 12:
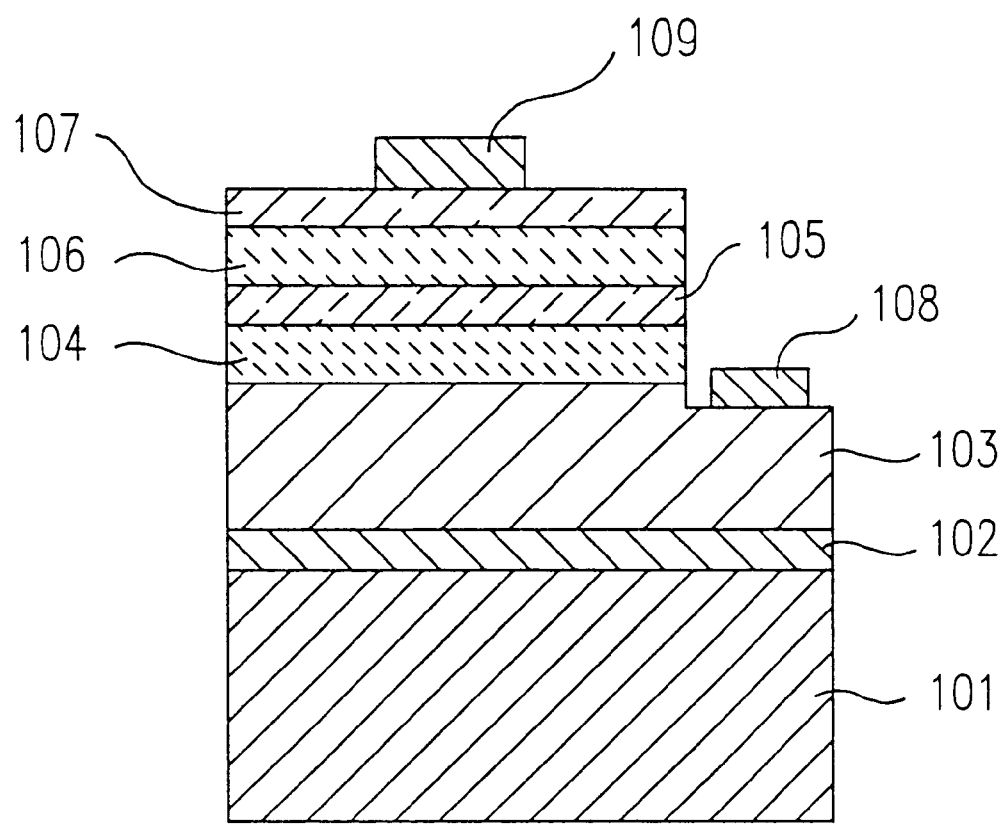
FIG. 12 is a cross-sectional view showing a conventional GaAlInN series semiconductor LED device.
Figure 13:
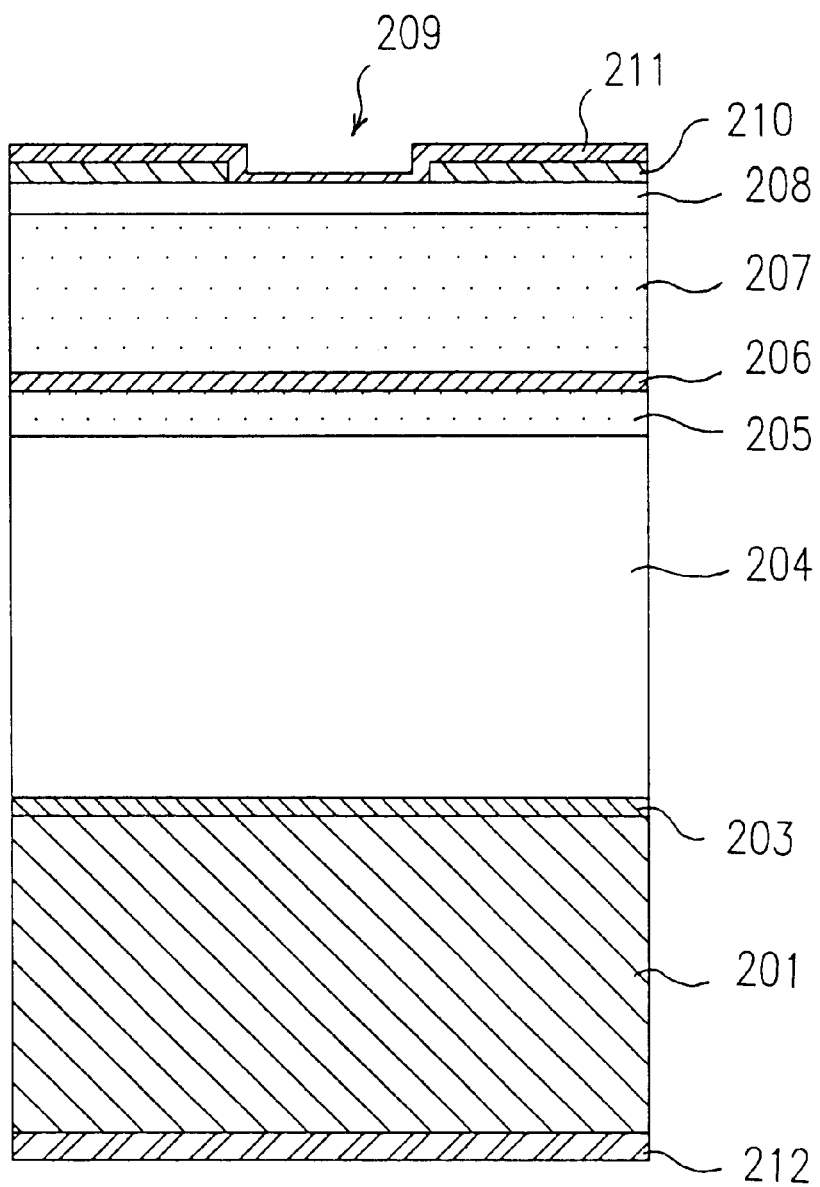
FIG. 13 is a cross-sectional view showing a conventional GaAlInN series semiconductor laser device.

FIG. 11 shows the p-type carrier concentration dependency of the contact resistance in the case where an Al/Ti electrode is formed on the p-type SiC layer. FIG. 11 also shows the p-type carrier concentration dependency of the full width at half maximum of the X-ray diffraction profile of the p-type SiC layer. As in the case of the GaN layer, the contact resistance decreases as the p-type contact resistance increases. When the p-type carrier concentration is about $1 \times 10^{16}$ cm$^{-3}$, the contact resistance is decreased to about $5 \times 10^{-9}$ $\Omega \cdot$cm$^2$. This is about 1/40 of the value in the case of the GaN layer. Moreover, the contact resistance is decreased to about $1 \times 10^{-9}$ $\Omega \cdot$cm$^2$ when the p-type carrier concentration is about $1 \times 10^{19}$ cm$^{-3}$. As in the case of the GaN layer, however, the full width at half maximum of the X-ray diffraction profile, indicative of the crystalline quality, increases as the p-type carrier concentration increases. The full width at half maximum of the X-ray diffraction profile is about 20 seconds when the p-type carrier concentration is about $1 \times 10^{17}$ cm$^{-3}$, but is increased to about 1000 seconds when the p-type carrier concentration is about $1 \times 10^{19}$ cm$^{-3}$. Nevertheless, the crystalline quality is relatively good as compared to the case of the GaN layer.

Thus, it is indicated that the p-type SiC layer is more suitable than the p-type GaN layer for forming a low-resistance ohmic electrode. Considering also the crystalline quality, the p-type carrier concentration of the p-type SiC layer is preferably in the range of about $1 \times 10^{17}$ cm$^{-3}$ to $1 \times 10^{19}$ cm$^{-3}$.

Examples 3 and 4 of the present invention based on this research will be described in detail hereinafter for an InGaAlN series light emitting device employing a p-type SiC substrate.

EXAMPLE 3

In Example 3 of the present invention, an AlGaN/InGaN double-hetero structure is grown on the p-type SiC substrate, thus producing a blue semiconductor laser device.

Figure 6:
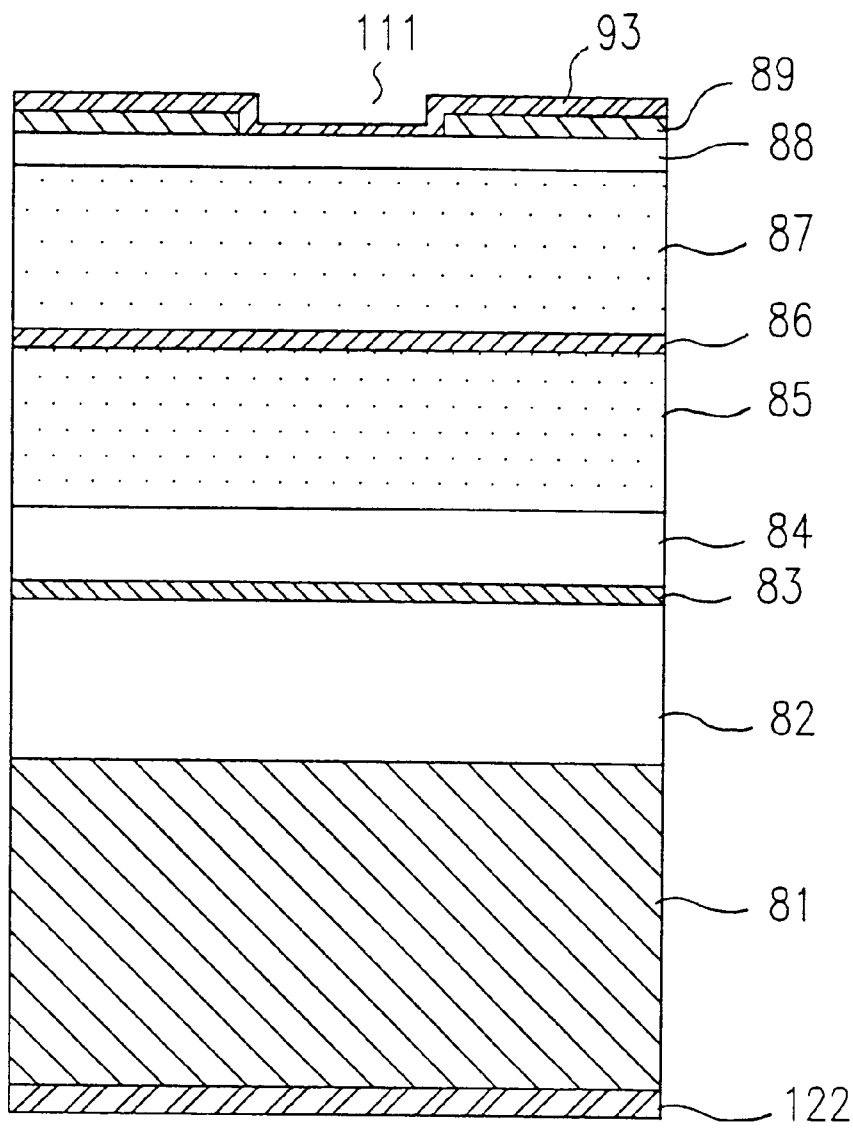
FIG. 6 is a cross-sectional view showing a structure of a III group nitride series compound semiconductor device according to Example 3 of the present invention.

FIG. 6 shows the structure of the blue semiconductor laser device according to Example 3 of the present invention. FIGS. 7A to 7D show the production process of the semiconductor laser device shown in FIG. 6. In the present example, III group nitride series compound semiconductor thin layers are grown by using an MOCVD method.

First a p-type 6H-SiC substrate 81, which is about 5° off a p-type (0001) carbon (C) surface toward the <1120> direction, is subjected to a surface polishing process and then an oxidization process, thereby removing the physical/chemical damage caused by the surface polishing process. The p-type 6H-SiC substrate 81 is then set in a reactor of an MOCVD apparatus. The reactor is well substituted by hydrogen, heated to about 1500° C. while supplying a hydrogen flow into the reactor, and maintained at the condition for about 10 minutes, thereby cleaning the surface of the p-type 6H-SiC substrate 81.

After cleaning the surface of the substrate 81, an SiC growth layer 82 is epitaxially grown on the SiC substrate 81 in the MOCVD apparatus. The SiC growth layer 82 is used for absorbing the adverse effect of the physical/chemical damage remaining at and in the vicinity of the surface of the SiC substrate 81 on layers which are to be formed above the SiC substrate 81 later, and therefore the thickness of the SiC growth layer 82 is determined considering the thickness of the damaged surface portion of the SiC substrate 81. In Example 3, the thickness of the damaged surface portion is 0.05 $\mu$m. Thus, the thickness of the SiC growth layer 82 is determined to be about 2 $\mu$m. The SiC growth layer 82 having the determined thickness is grown by supplying about 10 cc/min of silane gas and about 10 cc/min of propane gas as material gases (raw materials); about 10 l/min of hydrogen gas as a carrier gas; and TMA as an p-type impurity into the reactor for about 60 minutes.

Then, about $3 \times 10^{-5}$ mol/min of TMA and about 5 l/min of ammonium (NH$_3$) are supplied into the reactor for about 5 minutes, thereby growing an AlN layer 83 to be about 0.1 $\mu$m-thick. Then, about $3 \times 10^{-5}$ mol/min of TMG, about 5 l/min of NH$_3$, and about $5 \times 10^{-6}$ mol/min of Cp$_2$Mg are supplied into the reactor for about 15 minutes, thereby growing a p-type GaN layer 84 to be about 0.5 $\mu$m-thick.

Then, in addition to NH$_3$, TMG, and Cp$_2$Mg, about $6 \times 10^{-6}$ mol/min of TMA is supplied into the reactor for about 25 minutes, thereby growing a p-type Al$_{0.15}$Ga$_{0.85}$N layer 85 to be about 1 $\mu$m-thick.

The supplies of TMG, TMA, and Cp$_2$Mg are terminated and the reactor is cooled down to about 800° C. When the temperature becomes stable at about 800° C., TMG at the above-mentioned flow rate and about $4 \times 10^{-4}$ mol/min of TMI are supplied into the reactor for about 12 seconds, thereby growing an In$_{0.25}$Ga$_{0.75}$N layer 86 to be about 10 nm-thick. The emission peak wavelength from this layer at room temperature is about 432 nm.

Then, the supplies of TMG and TMI are terminated and the reactor is again heated to about 1050° C. When the temperature becomes stable at about 1050° C., TMG at the above-mentioned flow rate, TMA at the above-mentioned flow rate and about 0.3 cc/min of SiH$_4$ are supplied for about 25 minutes, thereby growing an n-type Al$_{0.15}$Ga$_{0.85}$N layer 87 to be about 1 $\mu$m-thick. The electron concentration of this layer is about $2 \times 10^{18}$ cm$^{-3}$.

Then, only the supply of TMA is terminated while letting the device grow for about 7.5 minutes, thereby growing an n-type GaN layer 88 to be about 300 nm-thick. The electron concentration of this layer is about $5 \times 10^{18}$ cm$^{-3}$.

Figure 7A:
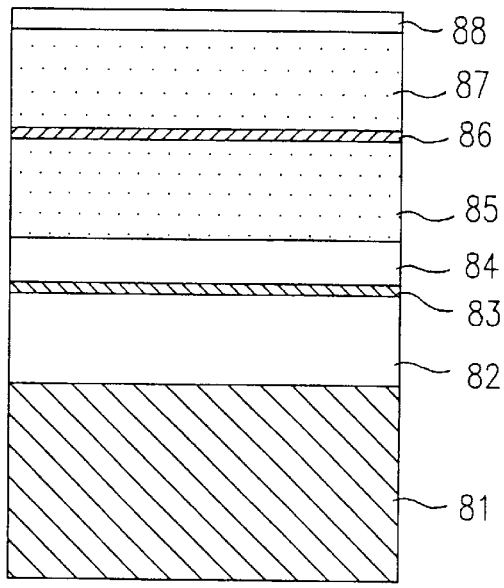
FIGS. 7A to 7D are cross-sectional views showing the production process of the III group nitride series compound semiconductor device according to Example 3 of the present invention.

Thus, the double-hetero multi-layer structure of the III group nitride series compound semiconductor is grown on the SiC growth layer 82 epitaxially grown on the p-type 6H-SiC substrate 81 (FIG. 7A). The wafer thus obtained is taken out of the MOCVD apparatus and subjected to a heat treatment in a nitrogen atmosphere at about 700° C. for about 20 minutes so as to lower the resistances of the Mg-doped p-type Al$_{0.15}$Ga$_{0.85}$N layer 85 and the p-type GaN layer 84. After this process, the hole concentration of the p-type $Al_{0.15}Ga_{0.85}N$ layer 85 is about $1 \times 10^{18}$ cm$^{-3}$, and that of the p-type GaN layer 84 is about $2 \times 10^{16}$ cm$^{-3}$.

Figure 7B:
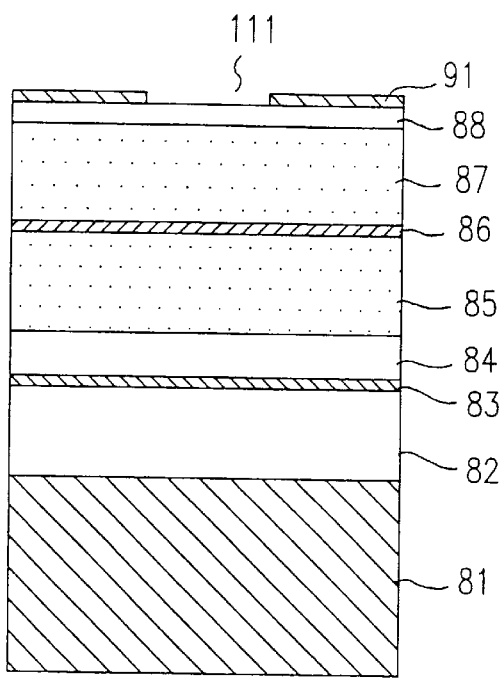
Figure 7C:
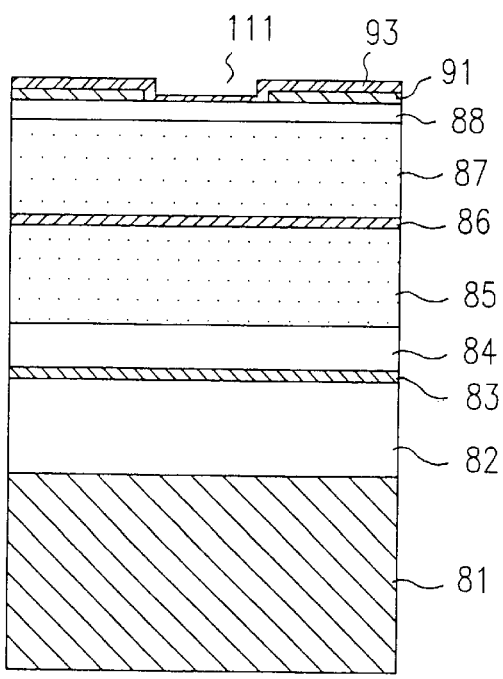

Then, an $Al_2O_3$ film 91 as a protective layer is formed on the epitaxial layer so as to form electrode strips each having a width of about 1 μm by using an electron beam deposition method, as shown in FIG. 7B. Then, an Al/Ti multi-layer film 93 is formed as an electrode, as shown in FIG. 7C.

Figure 7D:
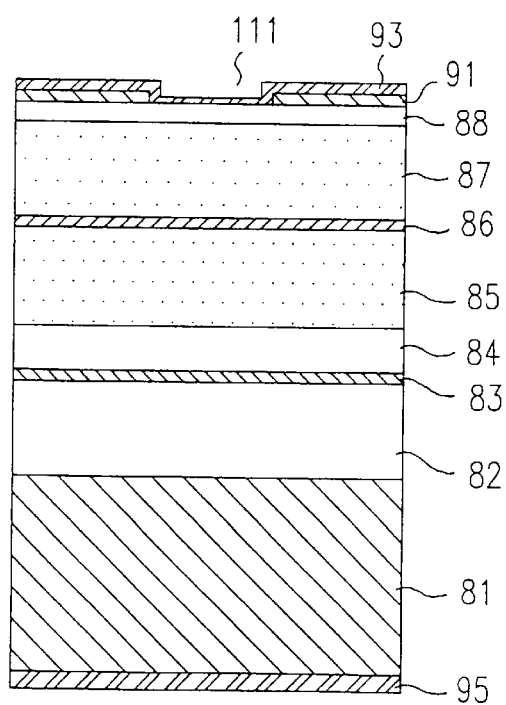

Next, an $SiO_2$ film is formed on the upper surface of the wafer by using an electron beam deposition method so as to be in strips each having a width of about 500 μm. The strips extend in the direction perpendicular to the direction of the electrode strips of the Al/Ti multi-layer film 91 and are spaced apart from one another by about 50 μm, thereby defining aperture strips of about 50 μm-wide. An ordinary electron beam deposition method and a photolithography process are used in this step. Then, the wafer with the $SiO_2$ film including the aperture strips is introduced into an RIE apparatus. For forming a reflection mirror, portions of the gallium nitride series semiconductor layer being exposed through the apertures of the $SiO_2$ film are etched off by using an ordinary RIE method until the p-type 6H-SiC substrate 81 is exposed therethrough. Then, after the p-type 6H-SiC substrate 81 is polished to be about 100 μm in thickness, Al/Ti is deposited on the entire bottom surface of the p-type 6H-SiC substrate 81 so as to form an ohmic electrode 95 on the p-type 6H-SiC substrate 81. Thus, the semiconductor layer device of Example 3 is produced, as shown in FIG. 7D.

When an electric current is applied to the produced semiconductor laser device, laser oscillation of a blue wavelength of about 432 nm is observed at a threshold current of about 40 mA.

After forming the p-type ohmic electrode on the bottom surface of the p-type 6H-SiC substrate 81, the contact resistance is reduced to some $10^{-8}$ Ω·cm$^2$, and the resistance of the device is reduced to about 30Ω.

EXAMPLE 4

In Example 4 of the present invention, an AlGaN/InGaN double-hetero structure is grown on the p-type SiC substrate, thus producing a blue LED.

Figure 8:
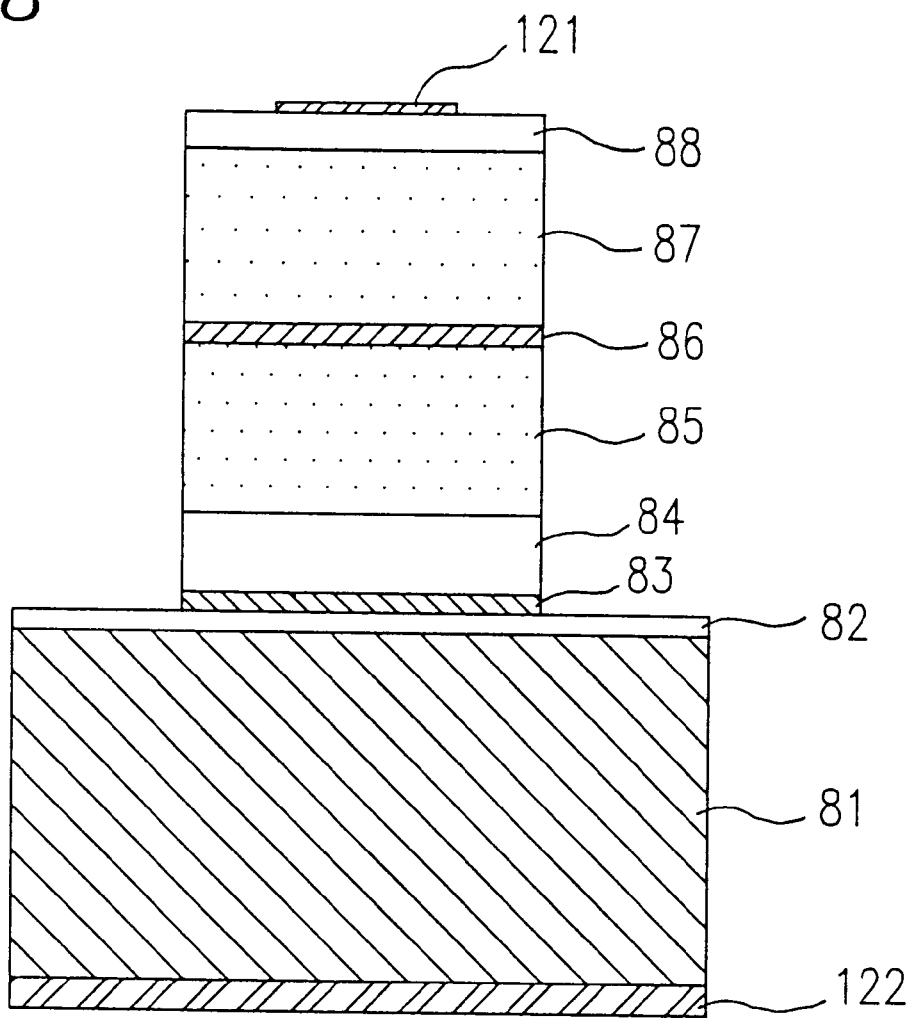
FIG. 8 is a cross-sectional view showing a structure of a III group nitride series compound semiconductor device according to Example 4 of the present invention.

FIG. 8 shows the structure of the III group nitride series compound semiconductor LED according to Example 4 of the present invention. FIGS. 9A to 9D show the production process of the III group nitride series compound semiconductor LED shown in FIG. 8. In the present example, III group nitride series compound semiconductor thin layers are grown by using an MOCVD method. The same components as those shown in FIGS. 6 and 7A to 7D are denoted by the same reference numerals.

First a p-type 6H-SiC substrate 81, which is about 5° off a p-type (0001) carbon (C) surface toward the <1120> direction, is subjected to a surface polish process and then an oxidization process, thereby removing the damaged layer on the substrate 81. The p-type 6H-SiC substrate 81 is then set in a reactor of an MOCVD apparatus. The reactor is well substituted by hydrogen, heated to about 1500° C. while supplying a hydrogen flow into the reactor, and maintained at the condition for about 10 minutes, thereby cleaning the surface of the p-type 6H-SiC substrate 81.

After cleaning the surface of the substrate 81, an SiC growth layer 82 is epitaxially grown on the SiC substrate 81 in the MOCVD apparatus. The SiC growth layer 82 is used for absorbing the adverse effect of the physical/chemical damage remaining at and in the vicinity of the surface of the SiC substrate 81 on layers which are to be formed above the SiC substrate 81 later, and therefore the thickness of the SiC growth layer 82 is determined considering the thickness of the damaged surface portion of the SiC substrate 81. In Example 3, the thickness of the damaged surface portion is 0.05 μm. Thus, the thickness of the SiC growth layer 82 is determined to be about 2 μm. The SiC growth layer 82 having the determined thickness is grown by supplying about 10 cc/min of silane gas and about 10 cc/min of propane gas as material gases (raw materials); about 10 l/min of hydrogen gas as a carrier gas; and TMA as an p-type impurity into the reactor for about 60 minutes.

Next, about $3 \times 10^{-5}$ mol/min of TMA and about 5 l/min of ammonium ($NH_3$) are supplied into the reactor for about 5 minutes, thereby growing an AlN layer 83 to be about 0.1 μm-thick on the SiC growth layer 82. Then, about $3 \times 10^{-5}$ mol/min of TMG, about 5 l/min of $NH_3$, and about $5 \times 10^{-6}$ mol/min of $Cp_2Mg$ are supplied into the reactor for about 15 minutes, thereby growing a p-type GaN layer 84 to be about 0.5 μm-thick on the AlN layer 83.

Then, in addition to $NH_3$, TMG, and $Cp_2Mg$, about $6 \times 10^{-6}$ mol/min of TMA is supplied into the reactor for about 15 minutes, thereby growing a p-type $Al_{0.15}Ga_{0.85}N$ layer 85 to be about 0.5 μm-thick.

The supplies of TMG, TMA, and $Cp_2Mg$ are terminated and the reactor is cooled down to about 800° C. When the temperature becomes stable at about 800° C., TMG at the above-mentioned flow rate and about $4 \times 10^{-4}$ mol/min of TMI are supplied into the reactor for about 4 seconds, thereby growing an $In_{0.25}Ga_{0.75}N$ layer 86 to be about 3 nm-thick. The emission peak wavelength from this layer at room temperature is about 432 nm.

Next, the supplies of TMG and TMI are terminated and the reactor is again heated to about 1050° C. When the temperature becomes stable at about 1050° C., TMG at the above-mentioned flow rate, TMA at the above-mentioned flow rate and about 0.3 cc/min of $SiH_4$ are supplied for about 15 minutes, thereby growing an n-type $Al_{0.15}Ga_{0.85}N$ layer 87 to be about 0.5 μm-thick. The electron concentration of this layer is about $2 \times 10^{18}$ cm$^{-3}$. Then, only the supply of TMA is terminated while letting the device grow for about 7.5 minutes, thereby growing an n-type GaN layer 88 to be about 300 nm-thick. The electron concentration of this layer is about $5 \times 10^{18}$ cm$^{-3}$.

Figure 9A:
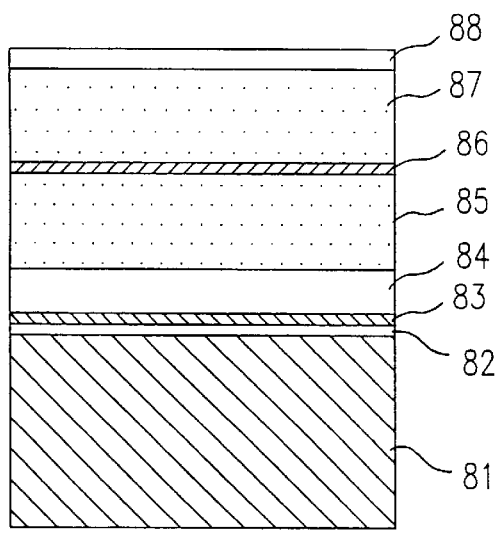
FIGS. 9A to 9D are cross-sectional view showing the production process of the III group nitride series compound semiconductor device according to Example 4 of the present invention.

Thus, the double-hetero multi-layer structure of the III group nitride series compound is grown on the SiC grown layer 82 as shown in FIG. 9A. The wafer thus obtained is taken out of the MOCVD apparatus and subjected to a heat treatment in a nitrogen atmosphere at about 700° C. for about 20 minutes so as to lower the resistances of the Mg-doped p-type $Al_{0.15}Ga_{0.85}N$ layer 85 and the p-type GaN layer 84. After this process, the hole concentration of the p-type $Al_{0.15}Ga_{0.85}N$ layer 85 is about $1 \times 10^{16}$ cm$^{-3}$, and that of the p-type GaN layer 84 is about $2 \times 10^{18}$ cm$^{-3}$.

Figure 9B:
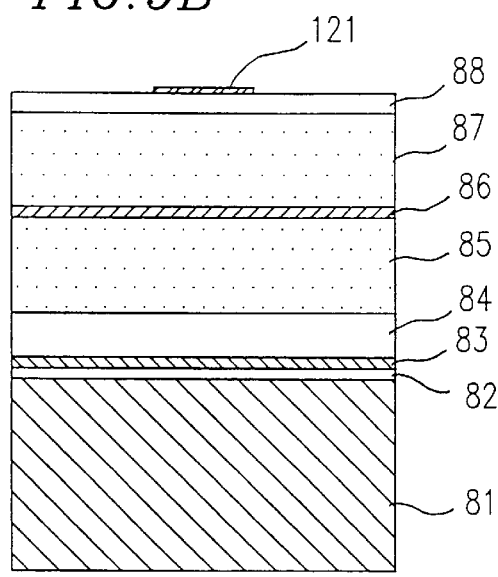

Then, an Al/Ti multi-layer film 121 is formed as electrodes in circles of about 130 μmφ on the epitaxial layer as shown in FIG. 9B.

Figure 9C:
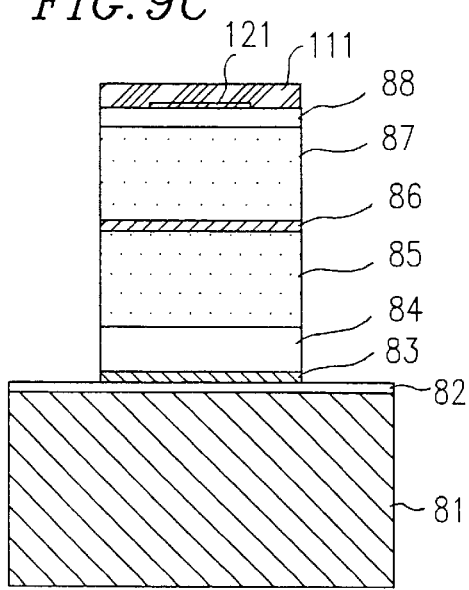
Figure 9D:
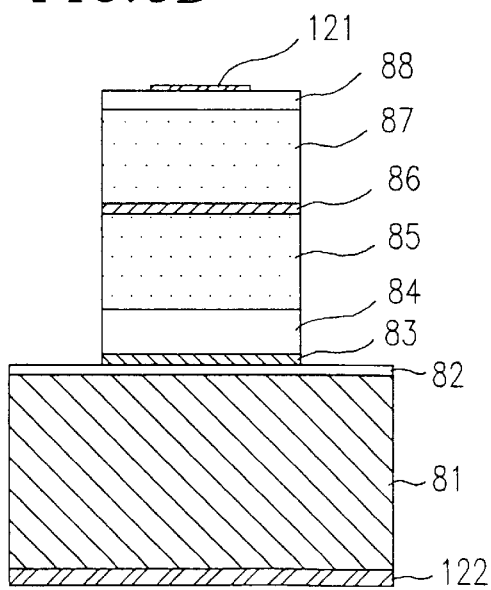

Then, an $SiO_2$ is deposited on the upper surface of the wafer by using an electron beam deposition method so as to form an $SiO_2$ film 111 in squares spaced apart from each other by about 300 μm and each having a side of about 170 μm-long with the center thereof being aligned with the center of the electrode of the Al/Ti multi-layer film 121. An ordinary electron beam deposition method and a photolithography process are used in this step. Then, the wafer including the $SiO_2$ film 111 in squares each having a side of about 170 μm-long is introduced into an RIE apparatus. Portions of the nitride gallium series semiconductor layer on which the SiO$_2$ film 111 is not formed are etched off by using an RIE method until the p-type 6H-SiC substrate 81 is exposed as shown in FIG. 9C. Then, the SiO$_2$ film 111 is removed by using buffered hydrofluoric acid. Then, after the p-type 6H-SiC substrate 111 is polished to be about 100 $\mu$m in thickness, Al/Ti is deposited on the entire bottom surface of the p-type 6H-SiC substrate 81 so as to form an ohmic electrode 122 on the p-type 6H-SiC substrate 81. Then, the wafer is diced with an interval of about 300 $\mu$m, thus producing the LED as shown in FIG. 9D.

When an electric current is applied to the produced device, blue light emission of about 432 nm is observed at a driving current of about 20 mA with a luminous intensity of about 2 cd.

After forming the p-type ohmic electrode on the bottom surface of the p-type 6H-SiC substrate 81, the contact resistance is reduced to some $10^{-8}$ $\Omega \cdot$cm$^2$, and the resistance of the device is reduced to about 10$\Omega$.

The LED which emits blue light of Example 4 employs the In$_{0.25}$Ga$_{0.75}$N active layer/Al$_{0.16}$Ga$_{0.85}$N cladding layer combination. However, the present invention is not limited to such a combination. Similar effects can be obtained by employing other combinations such as InGaN active layer/GaN cladding layer, or GaN active layer/AlGaN cladding layer.

Although the p-type 6H-SiC substrate 81, which is about 5° off an p-type (0001) carbon surface toward the <1120> direction, is used in Examples 3 and 4, similar effects can be obtained by using a substrate which is not 5° off the p-type surface. Moreover, the present invention is not limited to 6H-SiC. Similar or better effects can be obtained by employing 4H-SiC or, if available, 2H-SiC.

According to the present invention, the GaAlInN series compound semiconductor laser device is produced employing the SiC substrate on which the SiC growth layer for absorbing the defect is grown. The SiC growth layer suppresses the dislocation owing to the defect and/or the damage remaining at the surface of the SiC substrate. As a result, oscillation is observed at a low oscillation threshold current.

The thickness of the SiC growth layer, which is directly formed on the SiC substrate by an epitaxially growing technique, is preferably about 10 to 40 times the thickness of the damaged surface portion of the surface of the SiC substrate.

In particular, the present invention provides the nitride gallium series semiconductor laser device employing the p-type SiC substrate, where a desirable low-resistance p-type ohmic electrode is formed. As a result, laser oscillation is observed by current injection. Alternatively, the present invention provides the nitride gallium series LED, where a desirable low-resistance p-type ohmic electrode is formed. The driving voltage of the device is thus improved. The output of the LED is lowered only by about 10% or less after 10000 hours of a high-temperature reliability test at about 80° C., 20 mA. The reliability of the device is thus improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising:
   an SiC substrate;
   an SiC growth layer formed on the SiC substrate; and
   a plurality of Ga$_x$Al$_y$In$_{1-x-y}$N (0$\leq$x$\leq$1, 0$\leq$y$\leq$1) layers formed on the SiC growth layer;
   wherein the plurality of Ga$_x$Al$_y$In$_{1-x-y}$N layers include a p-n junction structure including an n-type GaAlInN layer and a p-type GaAlInN layer.

2. A semiconductor device according to claim 1, wherein a thickness of the SiC growth layer is about 10 to 40 times a thickness of a portion of the SiC substrate where the defect and/or damage exists.

3. A semiconductor device according to claim 1, wherein a thickness of the SiC growth layer is about 1 to 4 $\mu$m.

4. A semiconductor device according to claim 1, wherein the SiC growth layer contains an n-type impurity.

5. A semiconductor device according to claim 4, wherein the SiC growth layer contains nitrogen as the n-type impurity.

6. A semiconductor device according to claim 1, wherein the SiC substrate is a p-type SIC substrate.

7. A semiconductor device according to claim 6, wherein a carrier concentration of the p-type SiC substrate is in a range of about $1\times10^{17}$ cm$^{-3}$ to $1\times10^{19}$ cm$^{-3}$.

8. A semiconductor device according to claim 6, wherein the SiC growth layer contains a p-type impurity.

9. A semiconductor device according to claim 8, wherein the SiC growth layer contains aluminum as the p-type impurity.

10. A semiconductor device according to claim 1, further comprising a pair of electrodes so as to sandwich the SiC substrate, the SiC growth layer and the Ga$_x$Al$_y$In$_{1-x-y}$N layer therebetween.

11. A semiconductor device according to claim 6, further comprising a pair of electrodes so as to sandwich the SiC substrate, the SiC growth layer and the Ga$_x$Al$_y$In$_{1-x-y}$N layer therebetween.

12. A semiconductor device produced by epitaxially growing an SiC layer on an SiC substrate to have a thickness sufficient for absorbing a grating defect of the SiC substrate and/or damage at and in the vicinity of a surface of the SiC substrate; and forming a plurality of Ga$_x$Al$_y$In$_{1-x-y}$N (0$\leq$x$\leq$1, 0$\leq$y$\leq$1) layers on the SiC layer,
   wherein the SiC layer is formed on the SiC substrate and the plurality of Ga$_x$Al$_y$In$_{1-x-y}$N layers include a p-n junction structure including an n-type GaAlInN layer and a p-type GaAlInN layer.

13. A semiconductor device according to claim 4, wherein a carrier concentration of the SiC layer is in a range of $1\times10^{17}$ cm$^{-3}$ to $1\times10^{19}$ cm$^{-3}$.

14. A semiconductor device according to claim 8, wherein a carrier concentration of the SiC layer is in a range of $1\times10^{17}$ cm$^{-3}$ to $1\times10^{19}$ cm$^{-3}$.

15. A semiconductor device according to claim 1, wherein the SiC growth layer is formed for absorbing a defect of the SiC substrate and/or damage at and in the vicinity of a surface of the SiC substrate.

16. A semiconductor device according to claim 1, wherein the p-n junction structure includes an n-type GaAlN cladding layer, a GaInN active layer and a p-type GaAlN cladding layer.

17. A semiconductor device according to claim 1, wherein the p-n junction structure includes an n-type GaN cladding layer, a GaInN active layer and a p-type GaN cladding layer.

18. A semiconductor device according to claim 1, wherein the p-n junction structure includes an n-type GaAlN cladding layer, a GaN active layer and a p-type GaAlN cladding layer.

19. A semiconductor device according to claim 1, wherein the semiconductor device is a light emitting device.

20. A semiconductor device according to claim 19, wherein a double-hetero structure including the $Ga_xAl_yIn_{1-x-y}N$ layer is formed on the SiC growth layer grown on the SiC substrate.

21. A semiconductor device according to claim 12, wherein the p-n junction structure includes an n-type GaAlN cladding layer, a GaInN active layer and a p-type GaAlN cladding layer.

22. A semiconductor device according to claim 12, wherein the p-n junction structure includes an n-type GaN cladding layer, a GaInN active layer and a p-type GaN cladding layer.

23. A semiconductor device according to claim 12, wherein the p-n junction structure includes an n-type GaAlN cladding layer, a GaN active layer and a p-type GaAlN cladding layer.

24. A semiconductor device according to claim 12, wherein the semiconductor device is a light emitting device.

25. A semiconductor device according to claim 1, wherein the p-n junction structure has a double hetero structure.

26. A semiconductor device according to claim 12, wherein the p-n junction structure has a double hetero structure.

* * * * *